ELECTRICAL CIRCUIT DEVICE

Filed Aug. 2, 1965 2 Sheets-Sheet 1

INVENTORS
Hans-Jürgen Schütze &
Klaus Hennings
BY Spencer & Kaye
ATTORNEYS

ELECTRICAL CIRCUIT DEVICE

Filed Aug. 2, 1965

INVENTORS
Hans-Jürgen Schütze &
Klaus Hennings
BY Spencer & Kaye
ATTORNEYS

United States Patent Office 3,359,462
Patented Dec. 19, 1967

3,359,462

ELECTRICAL CIRCUIT DEVICE

Hans-Jürgen Schütze and Klaus Hennings, Ulm (Danube), Germany, assignors to Telefunken Patentverwertungsgesellschaft m.b.H., Ulm (Danube), Germany Filed Aug. 2, 1965, Ser. No. 476,556
Claims priority, application Germany, Aug. 4, 1964, T 26,733
5 Claims. (Cl. 317—101)

ABSTRACT OF THE DISCLOSURE

A semiconductor body having an insulating layer and at least one passive element provided on the layer and provided with a recess below the passive element and extending at least as far as the lateral dimensions of the element in such a manner that the element is supported exclusively by the insulating layer, which insulating layer has apertures therein in strip form at the margins of the passive element.

The present invention relates to a semiconductor device, particularly a hybrid circuit with low shunt capacitance, comprising a semiconductor body containing preferably active semiconductor elements and an insulating layer with passive elements and/or conducting paths thereon.

In electronic microminiaturization technology, a hybrid circuit is understood to mean a microminiaturized circuit arrangement using solid-state components, wherein passive elements and conducting paths are disposed on an insulating layer which is in turn disposed on the surface of a semiconductor body containing preferably active semiconductor elements. Connections to the elements in the semiconductor body of the hybrid circuit are established through apertures in the insulating layer.

In practice, the planar technique is used for the production of such devices, which generally utilize silicon semiconductor bodies. Planar transistors and planar diodes are produced, by means of diffusion and masking techniques, in the silicon semiconductor body, and the silicon oxide layer present on the surface of the silicon semiconductor body serves as a support for passive elements and conducting paths produced subsequently by vacuum deposition or sputtering. The oxide layers used in this case are generally very thin, having a thickness of about $1\mu$ or less. The consequence of this is that capacitive shunts to the semiconductor body occur with regard to the passive elements and/or conducting paths and reduce the frequency limit of the hybrid circuit.

It has already been suggested to provide an additional insulating layer on the passivation layer of the semiconductor body in order to reduce these unwanted shunts. It has also been suggested, in the case of vacuum-deposited resistors, to select a high sheet resistivity for the vacuum-deposited layers, for example, greater than 1 K$\Omega$ per square, or to make the resistance strips or conducting paths particularly narrow so as to reduce the influence of capacitance shunts in this manner. Although the application of an additional insulating layer is possible in principle, it requires considerable layer thickness for the effective reduction of the shunt capacitances because the permittivity of such insulating layers generally differs only insignificantly from that of the passivation layer of the semiconductor body. Moreover, the difference in the coefficients of heat expansion of the insulating layer and of the semiconductor body may lead to cracks in the insulating layer or to flaking thereof. Further, the additional provision of an insulating layer is technologically expensive. Physical limits are imposed on the production of high sheet resistivities because the results of making resistor film indefinitely thin is to render it virtually impossible to produce devices having uniform characteristics. Since other limits are imposed on resistor films, for example, with regard to the maximum value of the temperature coefficients, the fact that only a limited number of materials may be used creates further difficulties when attempts are made to increase the sheet resistivity.

It is, therefore, a principal object of the invention to provide a hybrid circuit which has a negligibly low shunt capacitance, and which neither requires the application of an additional insulating layer onto the insulating layer of the semiconductor body nor affects the material characteristics of the resistors, capacitors or conducting paths.

It is another object therein to provide a device of the above-described type which is simple and easy to fabricate.

According to the invention, the problem is solved in such a manner that a hybrid circuit is provided comprising a semiconductor body with semiconductor elements contained therein, an insulating layer which covers the semiconductor body, and passive elements, which may comprise conducting paths, on the insulating layer. The semiconductor body is recessed below the passive elements down to a predetermined depth and laterally at least as far as the lateral dimensions of the passive elements in such a manner that these passive elements are supported exclusively by the insulating layer.

The semiconductor device according to the invention has a particularly large bandwidth. The reason for this is that the time constant of the semiconductor device according to the invention is many times reduced in comparison with the time constant of conventional devices, this reduction being attributable to the recess in the semiconductor body produced by the removal of semiconductor material from below the passive elements and/or conducting paths and to the resulting reduction in the coupling capacitance, so that the bandwidth, which is known to be determined by the reciprocal value of the time constant, is increased to a corresponding extent.

Additional objects and advantages of the present invention will become apparent upon consideration of the following description when taken in conjunction with the accompanying drawings in which.

Figure 1:
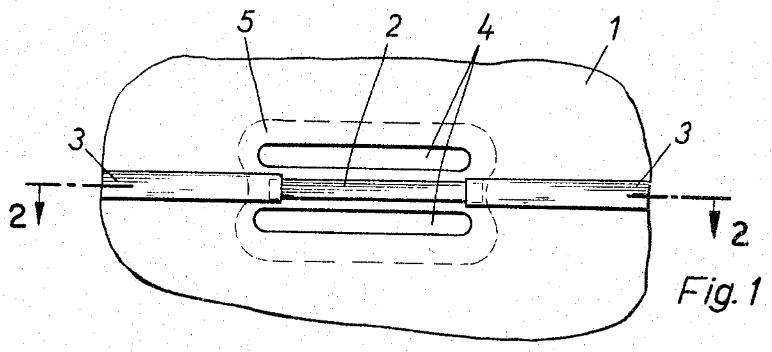
FIGURE 1 is a plan view of a portion of the surface of a circuit element according to the present invention.
Figure 2:
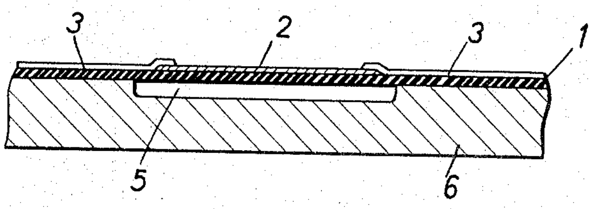
FIGURE 2 is a cross-sectional view taken along the plane 2—2 of FIGURE 1.

With more particular reference to the drawings, one example of an embodiment of the hybrid circuit according to the invention is illustrated in FIGURES 1 and 2. FIGURE 1 shows in plan view a portion of the surface of the hybrid circuit. On an insulating layer 1, for example, a layer of silicon oxide, there is is a strip-shaped resistor 2, to which contact is made, at its ends, through the conducting paths 3. At the longitudinal sides of the resistor 2, the insulating layer 1 is provided with apertures in the form of strips in the two regions 4. These apertures are produced in known manner by means of a photomasking technique which involves using light-sensitive varnish films followed by an etching process with a hydrofluoric-acid ammonium-bifluoride solution in the presence of an oxide layer. According to the invention, the semiconductor material below the resistor 2 and below the insulating layer 1 is removed through the apertures in the insulating layer by using selective etching media for the semiconductor body, for example, by using gas etching or organic etching solutions. The region in which the semiconductor material is removed, for example, is represented by the area 5 surrounded by a broken line.

FIGURE 2 shows a section 2—2 through the arrangement illustrated in FIGURE 1 in the plane of the resistor 2 and of the conducting path 3. The semiconductor body is designated by 6. As a result of the etching process, the recess 5 according to the invention is produced in the semiconductor body so that at this point the resistor 2 rests only on the thin insulating layer 1. It has been found that the stability of the insulating layer as a support for the passive elements above the recess 5 in the semiconductor body is fully adequate.

Figure 3:
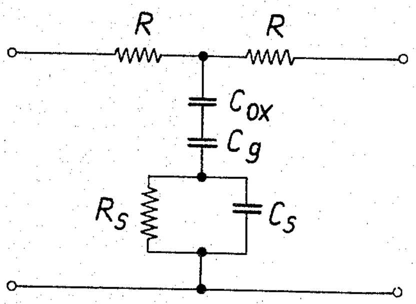
FIGURE 3 is a schematic diagram showing the equivalent electrical circuit of the element of FIGURES 1 and 2.

The mode of operation of the hybrid circuit according to the invention will be explained with reference to FIGURE 3. FIGURE 3 shows the electrical equivalent circuit relating to a very small part of the resistance of the solid-state circuit shown in FIGURES 1 and 2. Similar to the elementary four-poles of homogeneous transmission lines, such a portion of a vacuum-deposited resistor can be represented by a T-network with two resistors R in the longitudinal branch and the series connection of the capacitance $C_{ox}$ of the oxide layer, capacitance $C_g$ of the air gap between the oxide layer and the semiconductor body (produced by the recess in the semiconductor body), and the complex impedance of the semiconductor body in the transverse branch. The complex impedance of the semiconductor body is represented by the resistance $R_s$ and the capacitance $C_s$ connected in parallel. It can now be shown that the influence of $C_s$ on the total impedance in the transverse branch is negligible up to frequencies of at least 1 g.c.p.s. (g.=giga) if the specific resistance of the semiconductor body $\leqq 100\Omega$ cm. In this case, the dielectric relaxation time amounts to at most $10^{-10}$ sec. and the following equation is valid approximately for the time constant of the elementary four-pole shown in FIGURE 3:

$$\tau=\frac{R^2w^2}{d_n\rho_F}\epsilon_o\epsilon_n\frac{1}{1+\frac{d_{ox}}{d_q}\cdot\frac{\epsilon_q}{\epsilon_{ox}}} \quad (1)$$

In this equation, R is the resistance value of the vacuum deposited resistor having the width $w$ and the sheet resistance $\rho_F$. $d_g$ in Equation 1 is the depth of the recess in the semiconductor body below the insulating layer, $d_{ox}$ is the thickness of the oxide layer, $\epsilon_o$ the permittivity of a vacuum, $\epsilon_g$ the relative permittivity of the recess, that is to say, for air $\epsilon_g=1$, and $\epsilon_{ox}$ is the relative permittivity of the oxide layer. In general, the equation:

$$\frac{C_g}{C_{ox}}=\frac{d_{ox}\epsilon_g}{d_g\epsilon_{ox}}<1 \quad (2)$$

is satisfied. This can be seen immediately from the following numerical example which can easily be realized in practice:

$$\epsilon=1,\ d_g=5\mu,\ \epsilon_{cx}=5,\ d_{ox}=1\mu$$

With these values, the numerical value $1/25$ is obtained from Equation 2.

If the time constant of the elementary four-pole of the hybrid circuit arrangement according to the invention, which is described by the Equation 1, is compared with that which would result if the semiconductor body did not have any recess, namely $$\tau_o=\frac{R^2w^2}{d_{ox}\rho_F}\epsilon_o\epsilon_{ox} \quad (3)$$

then it will be seen that the time constant of the arrangement according to the invention is reduced approximately by the factor $$\frac{\tau}{\tau_o}=\frac{C_g}{C_{ox}}=\frac{d_{ox}}{d_g}\cdot\frac{\epsilon_g}{\epsilon_{ox}} \quad (4)$$

that is to say, in the case of the above-mentioned numerical example, to $1/25$ in comparison with conventional arrangements.

Figure 4:
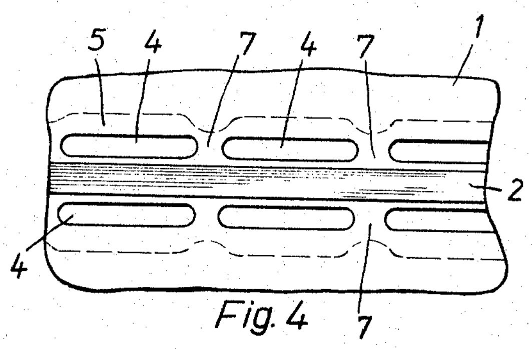
FIGURE 4 is a plan view of a portion of a further embodiment of the present invention.
Figure 5:
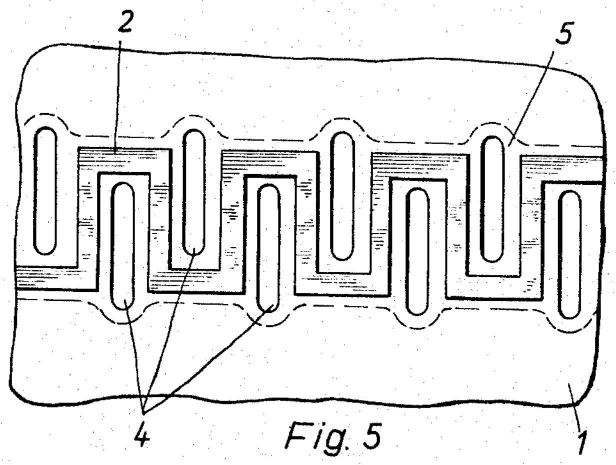
FIGURE 5 is a plan view of a portion of a still further embodiment.

Other embodiments of the present invention are illustrated in FIGURES 4 and 5. FIGURE 4 shows, in a plan view similar to that of FIGURE 1, a portion of the surface of an arrangement according to the invention. A resistance film 2 is provided on the insulating layer 1. The strip-shaped apertures 4 in the insulating layer 1 are arranged at intervals along the edge of the resistance film 2 at an appropriate distance therefrom. The webs 7 formed from the insulating layer between the individual apertures provide a particularly stable support for the portion of insulating layer 1 situated above the region 5 hollowed out of the semiconductor body and indicated in broken lines in the figure.

Finally, FIGURE 5 shows non-linear resistor path 2 disposed on the insulating layer 1 with apertures 4 interposed between the branches of the resistor. The region hollowed out of the semiconductor body is again illustrated by the area 5 surrounded by a broken line.

The recess in the semiconductor body below the passive elements and/or conducting paths may be also produced otherwise than through apertures in the insulating layer. According to the invention, it is also possible to produce this recessing by removing the semiconductor material starting from the lower surface of the semiconductor body.

It will be understood that the above description of the present invention is susceptible to various modifications, changes, and adaptations, and the same are intended to be comprehended within the meaning and range of equivalents of the appended claims.

What is claimed is:

1. A semiconductor device comprising a semiconductor body with at least one semiconductor element built into it, an insulating layer covering the semiconductor body, and at least one passive element provided on this layer, said semiconductor body having a recess disposed below said passive element and extending laterally at least as far as the lateral dimensions of said passive element for causing said passive element to be supported exclusively by said insulating layer, and wherein said insulating layer has apertures therein in strip form at the margins of said passive element.

2. A device as defined in claim 1, wherein said apertures in said insulating layer form intermittent strips along the margin of said passive element.

3. A device as defined in claim 1, wherein said passive element has a non-linear configuration and said apertures are interposed between the adjacent portions thereof.

4. A device as defined in claim 1 wherein said semiconductor body recess is disposed symmetrically with respect to said element.

5. A semiconductor device comprising a silicon semiconductor body with at least one semiconductor element built into it, a silicon oxide insulating layer covering the semiconductor body, and at least one passive element provided on this layer, said semiconductor body having a recess disposed below said passive element and extending laterally at least as far as the lateral dimensions of said passive element for causing said passive element to be supported exclusively by said insulating layer.

References Cited

UNITED STATES PATENTS

| | | | |
|---|---|---|---|
| 3,052,823 | 9/1962 | Anderson et al. | 317—101 |
| 3,179,854 | 4/1965 | Luedicke et al. | 317—101 |

ROBERT K. SCHAEFER, *Primary Examiner.*

J. R. SCOTT, *Assistant Examiner.*